(12) United States Patent
Oh

(10) Patent No.: US 8,482,094 B2
(45) Date of Patent: Jul. 9, 2013

(54) SEMICONDUCTOR DEVICE AND METHOD FOR FABRICATING THE SAME

(75) Inventor: Bo-Seok Oh, Chungcheongbuk-do (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 117 days.

(21) Appl. No.: 12/894,007

(22) Filed: Sep. 29, 2010

(65) Prior Publication Data

US 2011/0260294 A1 Oct. 27, 2011

(30) Foreign Application Priority Data

Apr. 21, 2010 (KR) .................. 10-2010-0036710

(51) Int. Cl.
*H01L 29/772* (2006.01)
*H01L 29/06* (2006.01)

(52) U.S. Cl.
USPC .................... 257/500; 257/E27.004; 438/224

(58) Field of Classification Search
None
See application file for complete search history.

(56) References Cited

U.S. PATENT DOCUMENTS

| | | | | |
|---|---|---|---|---|
| 6,314,021 B1* | 11/2001 | Maeda et al. | | 365/185.01 |
| 6,608,345 B2* | 8/2003 | Kunikiyo et al. | | 257/314 |
| 7,064,389 B2* | 6/2006 | Yoshida | | 257/348 |
| 7,205,630 B2* | 4/2007 | Chang et al. | | 257/500 |
| 7,271,083 B2* | 9/2007 | Tu et al. | | 438/597 |
| 7,304,342 B2* | 12/2007 | Nirschl et al. | | 257/301 |
| 7,427,552 B2* | 9/2008 | Jin et al. | | 438/424 |
| 7,858,490 B2* | 12/2010 | Mitsuhira et al. | | 438/427 |
| 8,120,094 B2* | 2/2012 | Liaw et al. | | 257/328 |
| 8,294,236 B2 | 10/2012 | Mitsuhira et al. | | |
| 2005/0093047 A1* | 5/2005 | Goda et al. | | 257/300 |
| 2005/0127473 A1* | 6/2005 | Sakagami | | 257/510 |
| 2006/0035437 A1* | 2/2006 | Mitsuhira et al. | | 438/424 |
| 2006/0043522 A1* | 3/2006 | Trivedi | | 257/506 |
| 2007/0102731 A1* | 5/2007 | Sakagami | | 257/207 |
| 2008/0213971 A1 | 9/2008 | Mitsuhira et al. | | |
| 2008/0303968 A1* | 12/2008 | Terada et al. | | 349/46 |
| 2009/0302413 A1* | 12/2009 | Kang | | 257/506 |
| 2011/0057287 A1 | 3/2011 | Mitsuhira et al. | | |
| 2012/0025295 A1* | 2/2012 | Sakagami | | 257/316 |

FOREIGN PATENT DOCUMENTS

| | | |
|---|---|---|
| CN | 1741273 A | 3/2006 |
| KR | 1020050015889 A | 2/2005 |
| KR | 10-2005-0020316 A | 3/2005 |
| KR | 10-2006-0050398 A | 5/2006 |
| KR | 100632068 B1 | 10/2006 |
| KR | 1020080060575 A | 7/2008 |

OTHER PUBLICATIONS

S. N. Keeney, "A 130 nm generation high density Etox\™ Flash memory technology", IEDM Tech. Dig., pp. 251-254 2001.*

(Continued)

*Primary Examiner* — Thomas L Dickey
*Assistant Examiner* — Joseph Schoenholtz
(74) *Attorney, Agent, or Firm* — NSIP Law

(57) ABSTRACT

A semiconductor device includes: a first well and a second well formed in a substrate and having a different impurity doping concentration; a first isolation layer and a second isolation layer formed in the first well and the second well, respectively, and having a different depth; and a third isolation layer formed in a boundary region in which the first well and the second well are in contact with each other, and having a combination type of the first isolation layer and the second isolation layer.

7 Claims, 11 Drawing Sheets

OTHER PUBLICATIONS

Yamashita, T.; Komori, S.; Horita, K.; Kawasaki, Y.; Inoue, Y.; Nishimura, T.;, "Highly reliable double well in thin p– on p+ epitaxial wafer for logic-embedded DRAM," Electron Devices Meeting, 1997. IEDM '97. Technical Digest., International, pp. 673-676, Dec. 7-10, 1997.*

Notice of Reason for Refusal KIPO dated Jul. 8, 2011.*

Chinese Office Action issued Jan. 16, 2013 in counterpart Chinese Application No. 201010518461.X (15 pages, including English translation).

* cited by examiner

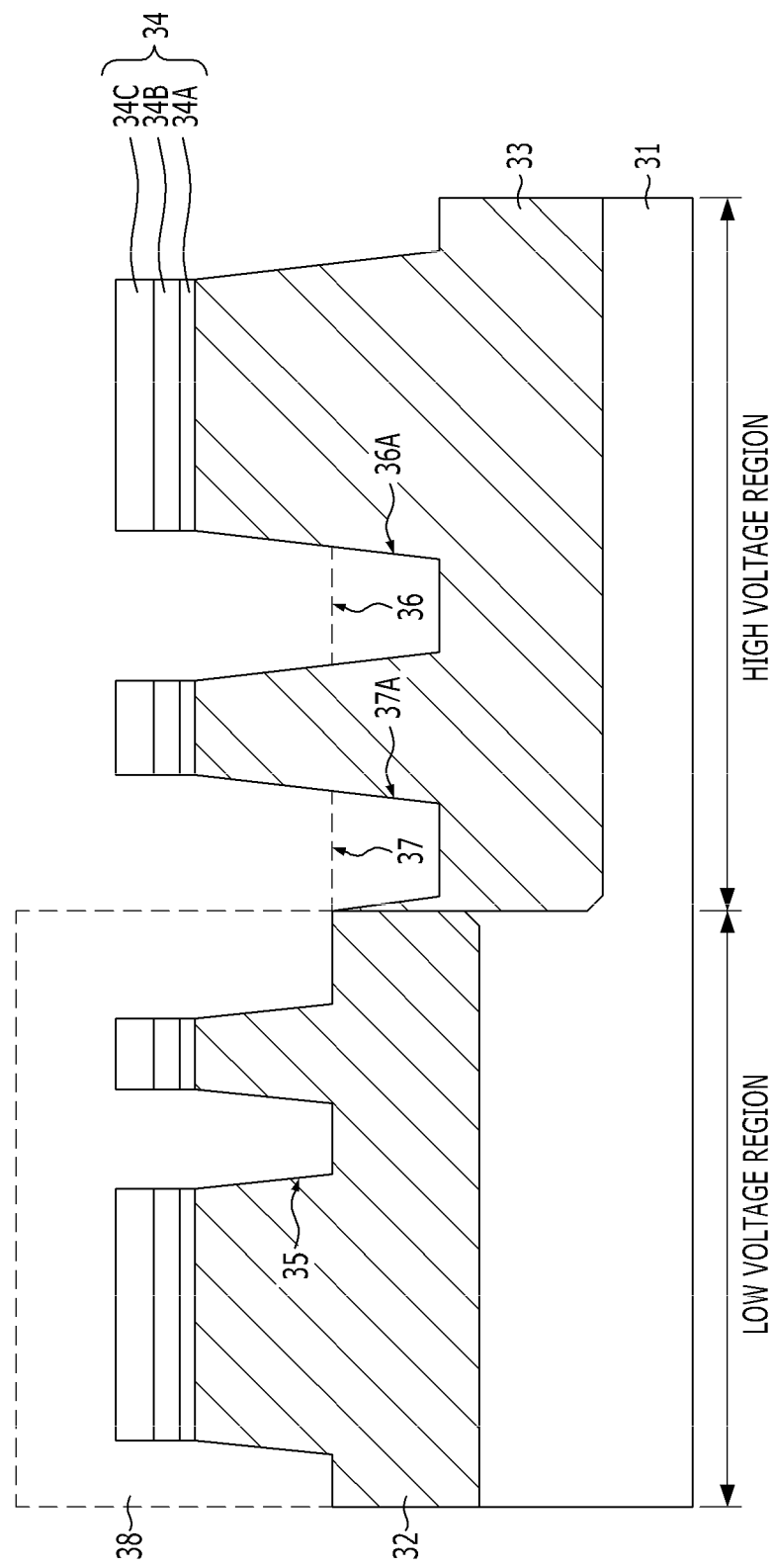

SEMICONDUCTOR DEVICE AND METHOD FOR FABRICATING THE SAME

CROSS-REFERENCE TO RELATED APPLICATIONS

The present application claims priority of Korean Patent Application No. 10-2010-0036710, filed on Apr. 21, 2010, which is incorporated herein by reference in its entirety.

BACKGROUND

1. Field

The following description relates to a semiconductor device and a method for fabricating the same.

2. Description of Related Art

A semiconductor device includes a plurality of structures, for example, transistors. The respective transistors have different operating voltages. That is, the semiconductor device is fabricated by integrating a plurality of high-voltage transistors and a plurality of low-voltage transistors into a single chip or die.

Meanwhile, the semiconductor device requires isolation layers which electrically isolate the transistors having different operating voltages. The isolation layers have different shapes, that is, critical dimensions and/or depths, according to the operating voltages of the transistors. In general, the isolation layers which isolate the plurality of high-voltage transistors from one another have critical dimensions and depths larger than those of the isolation layers which isolate the plurality of low-voltage transistors.

FIGS. 1A to 1E are cross-sectional views illustrating a conventional method for fabricating a semiconductor device.

Referring to FIG. 1A, a substrate 11 has a high-voltage region in which a high-voltage transistor is to be formed, and a low-voltage region in which a low-voltage transistor is to be formed. The low-voltage transistor is a transistor which has an operating voltage lower than that of the high-voltage transistor. A first well 12 and a second well 13 are formed by implanting impurity ions into the low-voltage region and the high-voltage region of the substrate 11, respectively.

A hard mask pattern 14 is formed on the substrate 11, and a plurality of trenches are formed in the high-voltage region and the low-voltage region by etching the substrate 11 using the hard mask pattern 14 as an etch barrier. Hereinafter, the trench formed in the low-voltage region will be referred to as a first trench 15, and the trench formed in the high-voltage region will be described as a second trench 16.

Referring to FIG. 1B, a sacrificial pattern 17 is formed to cover the high-voltage region and expose the low-voltage region. An insulation layer 18 is deposited over the substrate 11 to fill the first trench 15.

Referring to FIG. 1C, a first isolation layer 18A is formed in the low-voltage region by performing a planarization process until the top surface of the hard mask pattern 14 is exposed. The sacrificial pattern 17 is removed to expose the trench of the high-voltage region, that is, the second trench 16.

The bottom surface of the second trench 16 of the high-voltage region is additionally etched using the hard mask pattern 14 as an etch barrier to thereby increase the depth of the second trench 16. Hereinafter, the second trench 16 whose depth is increased will be represented by reference numeral "16A".

Referring to FIG. 1D, an insulation layer 19 is deposited over the substrate 11 to completely fill the second trench 16A.

In order to eliminate the height difference of the insulation layer 19 which is caused by the first isolation layer 18A having been formed in the low-voltage region, a photoresist pattern 20 is formed to cover the high-voltage region. The height difference of the insulation layer 19 between the high-voltage region and the low-voltage region is reduced by partially etching the insulation layer 19 formed in the low-voltage region. The photoresist pattern 20 is then removed.

Referring to FIG. 1E, a second isolation layer 19A is formed in the high-voltage region by performing a planarization process until the top surface of the hard mask pattern 14 is exposed, and the hard mask pattern 14 is removed.

The semiconductor device fabricated through the above-described processes has a structure in which the first isolation layer 18A is disposed at one side of a boundary region, in which the first well 12 and the second well 13 are in contact with each other, and the second isolation layer 19A is disposed at the other side thereof. Thus, stress is concentrated in the boundary region in which the first well 12 and the second well 13 are in contact with each other (see reference symbol "A" of FIG. 1E). In particular, since the gap between the boundary regions in which the first and second isolation layers 18A and 19A and the first and second wells 12 and 13 are in contact with one another is narrow, stress is further concentrated. The concentration of stress degrades the characteristics of the semiconductor device which will be fabricated in the first and second wells 12 and 13 through subsequent processes.

Furthermore, since the first well 12 and the second well 13 are in contact with each other between the first and second isolation layers 18A and 19A, the inter-well breakdown voltage characteristic and leakage current characteristic are degraded by the difference of the operating voltage between the high-voltage region and the low-voltage region. In order to improve the inter-well breakdown voltage characteristic and leakage current characteristic, the gap between the first and second isolation layers 18A and 19A adjacent to the boundary region in which the first and second wells 12 and 13 are in contact with each other must be increased. However, if the gap between the first and second isolation layers 18A and 19A is increased, the integration density of the semiconductor device is lowered.

Moreover, since the surfaces of the first well 12 and the second well 13 in their contact region are in the exposed state, an inter-well electrical short occurs when a silicide process is performed.

SUMMARY

In a general aspect, a semiconductor device includes: a first well and a second well formed in a substrate and having a different impurity doping concentration; a first isolation layer and a second isolation layer formed in the first well and the second well, respectively, wherein the first and second isolation layer are of different types; and a third isolation layer formed in a boundary region in which the first well and the second well are in contact with each other, and being formed by a combination of the first isolation layer type and the second isolation layer type.

The substrate may have a low-voltage region and a high-voltage region, the first well may be disposed in the low-voltage region, and the second well may be disposed in the high-voltage region. The impurity doping concentration of the first well may be higher than the impurity doping concentration of the second well.

The depth of the first isolation layer may be smaller than the depth of the second isolation layer.

The third isolation layer may have a first bottom surface and a second bottom surface lower than the first bottom surface. The first bottom surface may have a height substantially equal to a height of the bottom surface of the first isolation layer, and the second bottom surface may have a height substantially equal to a height of the bottom surface of the second isolation layer. An interface in which the first bottom surface and the second bottom surface are in contact with each other may be aligned with an interface in which the first well and the second well are in contact with each other.

In another general aspect, a method for fabricating a semiconductor device includes: forming a first well and a second well having a different impurity doping concentration on a substrate; forming a trench by etching the substrate of a boundary region in which the first well and the second well are in contact with each other; forming a sacrificial pattern covering a portion of the bottom surface of the trench; etching the exposed bottom surface of the trench by using the sacrificial pattern as an etch barrier; removing the sacrificial pattern; and filling the trench with an insulation material to form an isolation layer having two different depths with respect to a top surface of the substrate.

The substrate may have a low-voltage region and a high-voltage region, the first well may be disposed in the low-voltage region, and the second well may be disposed in the high-voltage region. The impurity doping concentration of the first well may be higher than the impurity doping concentration of the second well.

The isolation layer may have a first bottom surface and a second bottom surface lower than the first bottom surface, and an interface in which the first bottom surface and the second bottom surface are in contact with each other may be aligned with an interface in which the first well and the second well are in contact with each other.

In yet another general aspect, a method for fabricating a semiconductor device includes: forming a first well and a second well having a different impurity doping concentration on a substrate; selectively etching the substrate to form a first trench and a second trench in the first well and the second well, respectively, and form a third trench in a boundary region in which the first well and the second well are in contact with each other; forming a sacrificial pattern filling the first trench and covering a portion of the bottom surface of the third trench; etching the bottom surface of the second trench and the exposed bottom surface of the third trench by using the sacrificial pattern as an etch barrier; removing the sacrificial pattern; and filling the first trench, the second trench, and the third trench with an insulation material to form a first isolation layer and a second isolation layer in the first well and the second well, respectively, and form a third isolation layer in the boundary region in which the first well and the second well are in contact with each other, the third isolation layer having two different depths with respect to a top surface of the substrate.

The substrate may have a low-voltage region and a high-voltage region, the first well may be disposed in the low-voltage region, and the second well may be disposed in the high-voltage region. The impurity doping concentration of the first well may be higher than the impurity doping concentration of the second well.

The third isolation layer may have a first bottom surface having a height substantially equal to a height of the bottom surface of the first isolation layer, and a second bottom surface may have a height substantially equal to a height of the bottom surface of the second isolation layer. An interface in which the first bottom surface and the second bottom surface are in contact with each other may be aligned with an interface in which the first well and the second well are in contact with each other.

After forming the first well and the second well, the method may further include forming a hard mask pattern on the substrate in order to form the first trench, the second trench, and the third trench. The hard mask pattern may have a structure in which a first oxide layer, a nitride layer, and a second oxide layer are sequentially stacked. The second oxide layer may be deposited by an LPCVD process and may be formed to a thickness ranging from approximately 100 nm to approximately 300 nm.

In still another general aspect, a method for fabricating a semiconductor device includes: sequentially depositing a first insulation layer, a second insulation layer, and a third insulation layer on a substrate, and forming a hard mask pattern by etching the first trench, the second trench, and the third trench until the substrate is exposed; forming a trench by etching the substrate using the hard mask pattern as an etch barrier; forming a sacrificial pattern covering a portion of the bottom surface of the trench and one side of the trench; etching the exposed bottom surface of the trench using the sacrificial pattern as an etch barrier; removing the sacrificial pattern; and filling the trench with an insulation material to form an isolation having two different depths with respect to a top surface of the substrate.

In a further general aspect, a semiconductor device includes: a substrate of a first conductivity type; a first well of a second conductivity type disposed on the substrate; a second well of the second conductivity type disposed on the substrate and having an impurity doping concentration lower than that of the first well; a first isolation layer disposed in the first well; a second isolation layer disposed in the second well and having a depth lager than that of the first isolation layer; and a third isolation layer disposed in a boundary region in which the first well and the second well are in contact with each other, and having a structure in which the first isolation layer and the second isolation are combined.

BRIEF DESCRIPTION OF THE DRAWINGS

FIGS. 3A to 3G are cross-sectional views illustrating an example of a method for fabricating a semiconductor device.

DETAILED DESCRIPTION

Figure 1A:
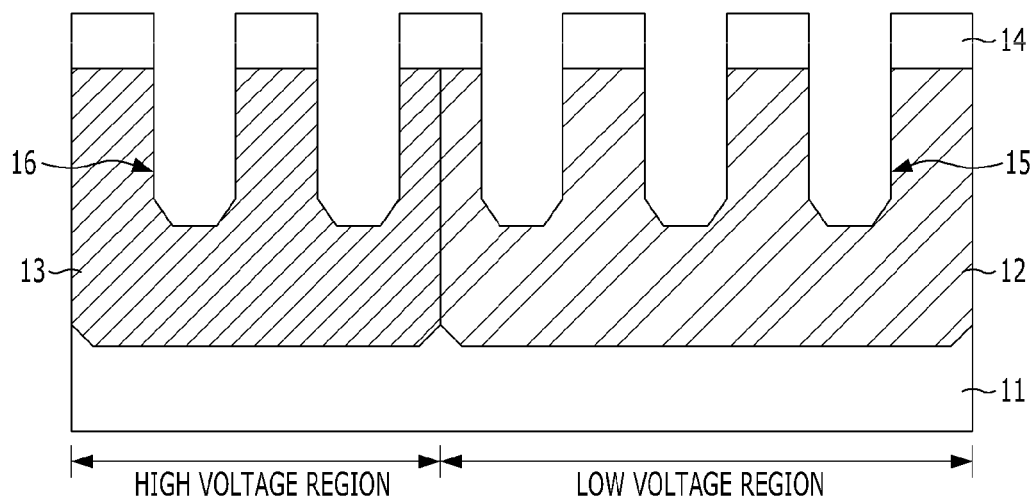
FIGS. 1A to 1E are cross-sectional views illustrating a method for fabricating a conventional semiconductor device.
Figure 1B:
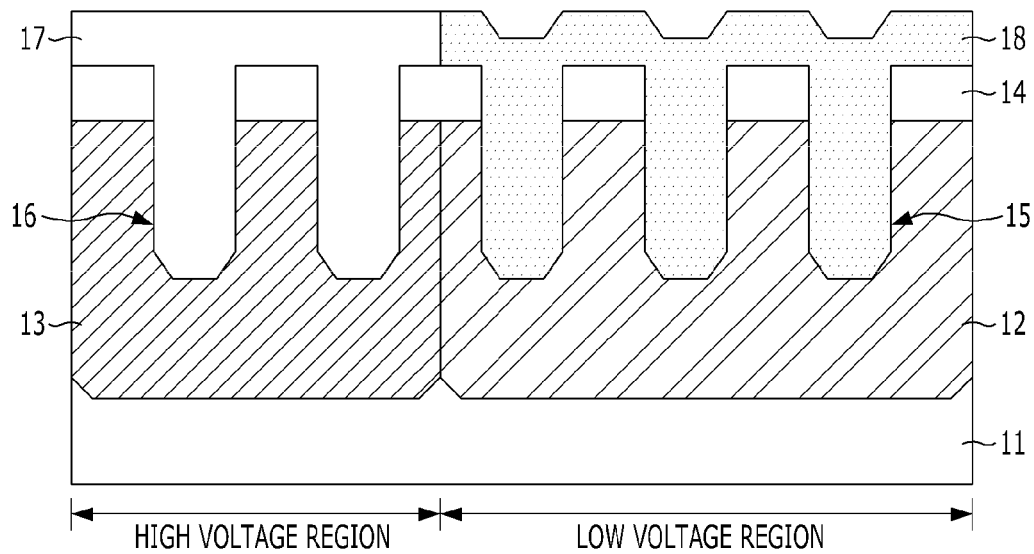
Figure 1C:
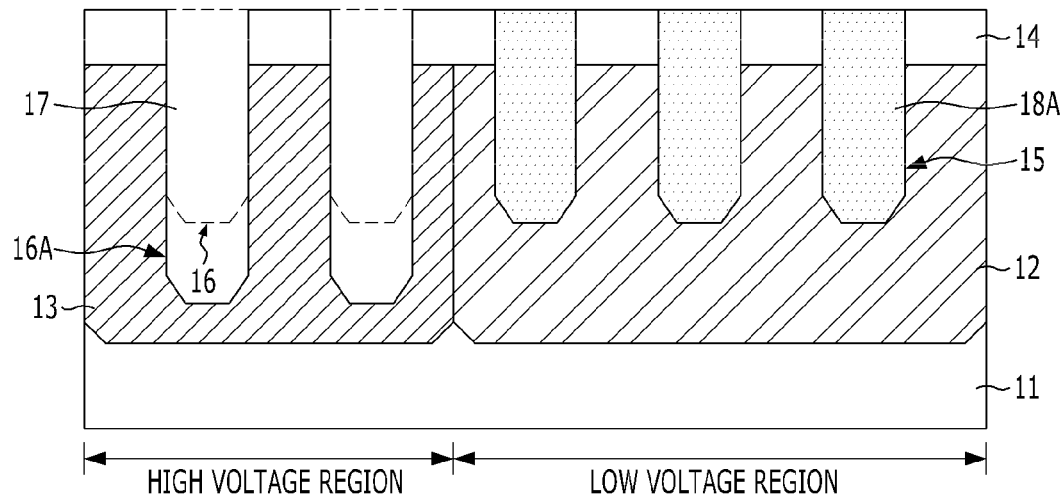
Figure 1D:
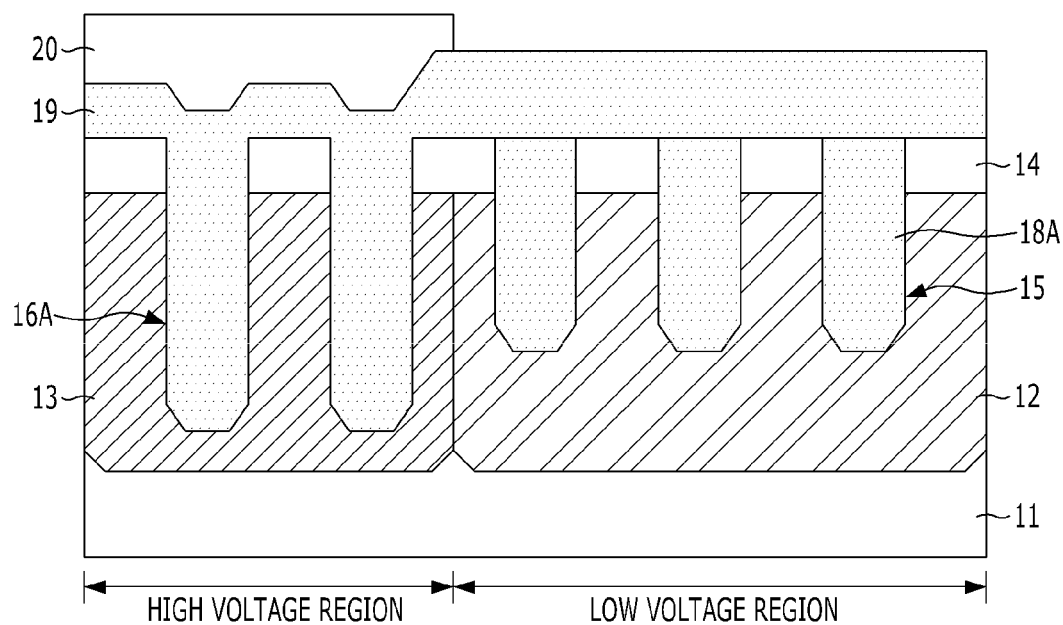
Figure 1E:
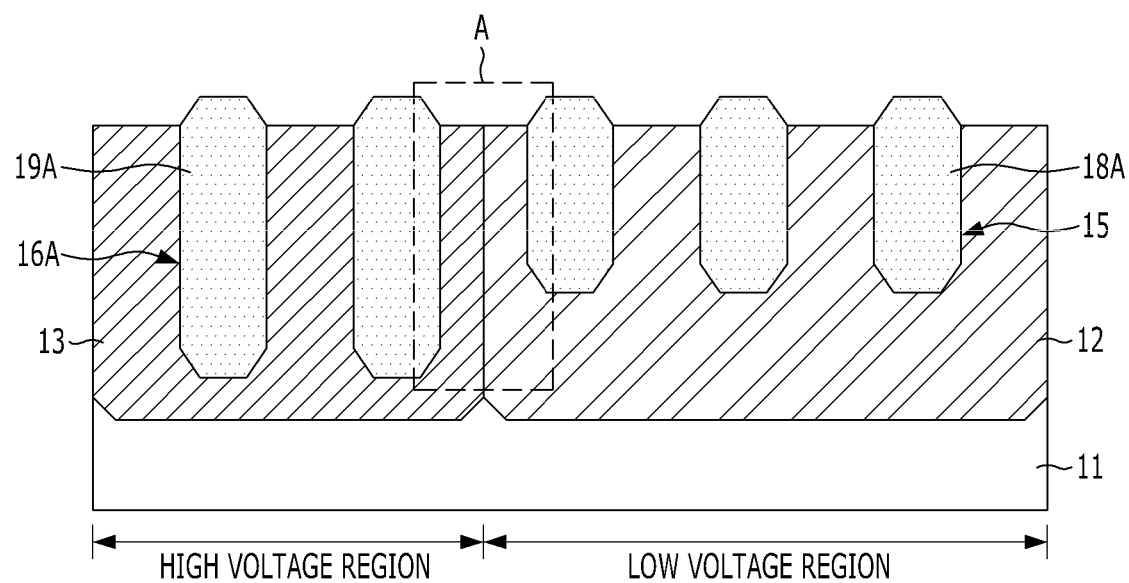

The following examples will be described below with reference to the accompanying drawings. The examples may, however, be illustrated in different forms and should not be constructed as limited to the illustration set forth herein. Rather, these example illustrations are provided so that this disclosure will be thorough and complete, and will fully convey the scope of the examples to those skilled in the art. Throughout the disclosure, like reference numerals refer to like parts throughout the various figures and illustrations of the examples.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

The following description is directed to a semiconductor device and a method for fabricating the same.

In general, in case where the semiconductor device includes a plurality of transistors having different operating voltages, isolation layers having different depths and critical dimensions according to the operating voltages are composed of a combination of shallow trench isolation (STI) and deep trench isolation (DTI). However, since the isolation layer formed through the DTI process cannot vary the critical dimension of the isolation layer, there are a lot of limitations on the design of the semiconductor device. Also, since the STI process and the DTI process cannot be performed at the same time, a lot of process time is taken.

In order to solve those problems, examples are directed to a semiconductor device and a method for fabricating the same.

Figure 2:
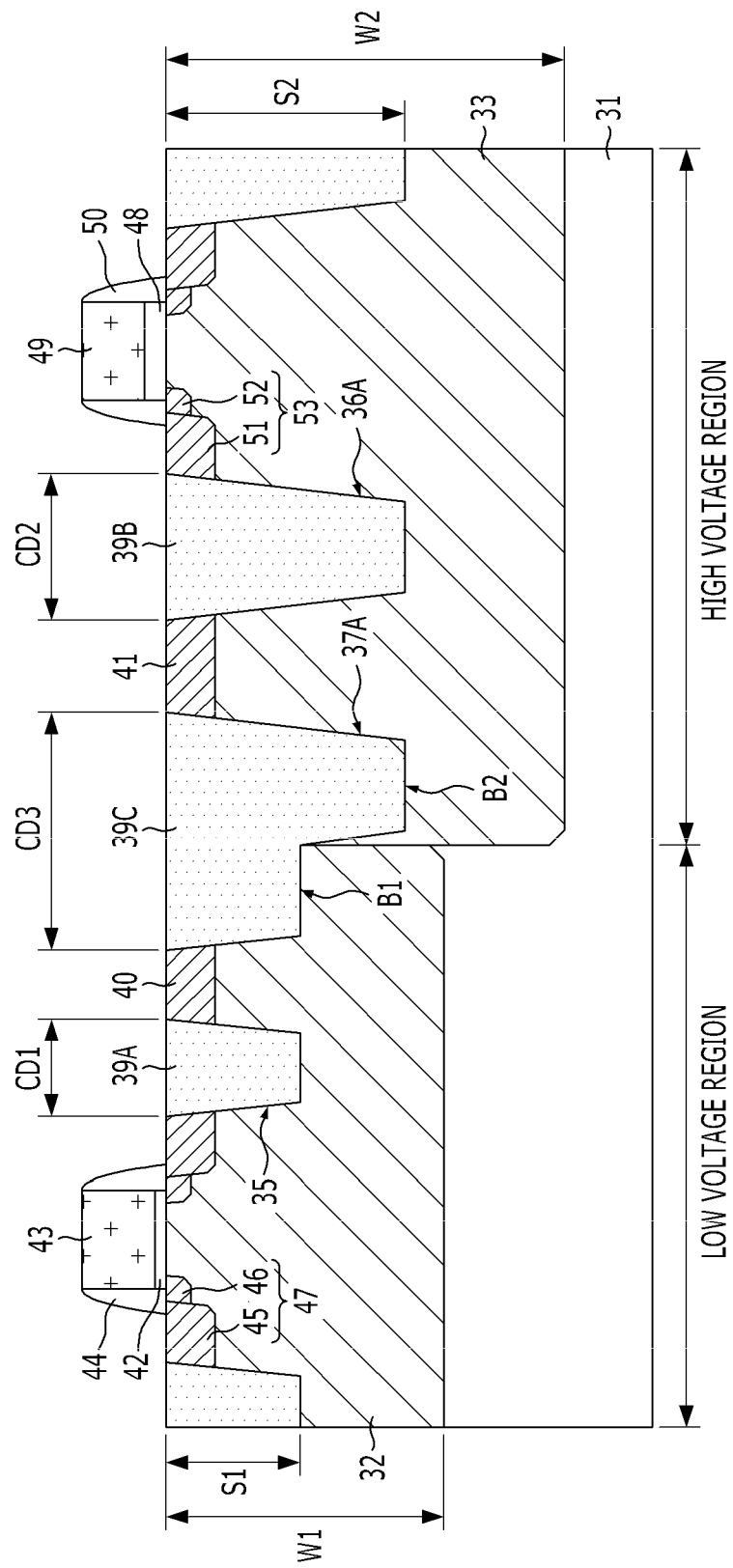
FIG. 2 is a cross-sectional view illustrating an example of a semiconductor device.

FIG. 2 is a cross-sectional view illustrating an example of a semiconductor device.

Referring to the example illustrated in FIG. 2, the semiconductor device includes a substrate 31 having a low-voltage region and a high-voltage region, a first well 32 and a second well 33, which are formed in the low-voltage region and the high-voltage region of the substrate 31, respectively, a first isolation layer 39A formed in the first well 32 and having an STI structure, a second isolation layer 39B formed in the second well 33 and having an MTI structure, and a third isolation layer 39C formed in a boundary region in which the first well 32 and the second well 33 are in contact with each other and having a combination type of the first isolation layer 39A and the second isolation layer 39B. The low-voltage region may have an operating voltage ranging from approximately 0.5 V to approximately 8 V, and the high-voltage range may have an operating voltage ranging from approximately 9 V to approximately 100 V.

The first well 32 and the second well 33 may have the same conductivity type or complementary conductive types. As one example, when the first well 32 is N-type, the second well 33 may be N-type or P-type. When the second well 33 is N-type, the first well 32 may be N-type or P-type.

The impurity doping concentration of the first well 32 may be higher than the impurity doping concentration of the second well 33. For reference, in order to ensure a breakdown voltage, the well for the formation of the high-voltage semiconductor device is formed to have a lower impurity doping concentration than that of the well for the formation of the low-voltage semiconductor device. As one example, the first well 32 may have the impurity doping concentration ranging from approximately $1 \times 10^{17}$ atoms/cm$^3$ to approximately $1 \times 10^{18}$ atoms/cm$^3$, and the second well 33 may have the impurity doping concentration ranging from approximately $1 \times 10^{16}$ atoms/cm$^3$ to approximately $1 \times 10^{17}$ atoms/cm$^3$. That is, the impurity doping concentration of the first well 32 is higher than the impurity doping concentration of the second well 33 by 1 order. The impurity doping concentration may be changed, depending on ion dose and annealing condition.

The depth W1 of the first well 32 may be smaller than the depth W2 of the second well 33. For example, the first well 32 may have the depth W1 ranging from approximately 2 μm to approximately 3 μm, and the second well 33 may have the depth W2 ranging from approximately 3 μm to approximately 7 μm. The reason why the second well 33 is deeper than the first well 32 is that an annealing is performed at a high temperature after an impurity ion implantation process for forming the second well 33 in order to diffuse the implanted impurities.

The depth S2 of the second isolation layer 39B formed in the second well 33 and having the MTI structure may be larger than the depth S1 of the first isolation layer 39A formed in the first well 32 and having the STI structure (S2>S1). That is, the bottom surface of the second isolation layer 39B may be lower than the bottom surface of the first isolation layer 39A. Furthermore, the critical dimension S2 of the second isolation layer 39B may be larger than the critical dimension CD1 of the first isolation layer 39A (CD1<CD2>). For example, the first isolation layer 39A having the STI structure may have the depth S1 ranging from approximately 0.3 μm to approximately 0.5 μm, and the second isolation 39B having the MTI structure may have the depth S2 ranging from approximately 0.7 μm to approximately 2 μm. The first isolation layer 39A may have the critical dimension CD1 ranging from approximately 0.15 μm to approximately 0.4 μm, and the second isolation layer 39B may have the critical dimension CD2 ranging from approximately 0.3 μm to approximately 0.8 μm.

The third isolation layer 39C formed in the boundary region in which the first well 32 and the second well 33 are in contact with each other serves to substantially prevent stress from being concentrated in the boundary region in which the first well 32 and the second well 33 are in contact with each other by the isolation layer, and also serves to separate the semiconductor device formed in the first well 32 from the semiconductor device formed in the second well 33. Moreover, the third isolation layer 39C serves to improve the breakdown voltage characteristic and leakage current characteristic between the first well 32 and the second well 33, and also serves to facilitate a silicide process.

The third isolation layer 39C may have a first bottom surface B1 and a second bottom surface B2 lower than the first bottom surface B1. That is, the third isolation layer 39C may have a "⊓" shape having two different depths with respect to the top surface of the substrate 31. The first bottom surface B1 of the third isolation layer 39C may have the height substantially equal to the bottom surface of the first isolation layer 39A, and the second bottom surface B2 of the third isolation layer 39C may have the height substantially equal to the bottom surface of the second isolation layer 39B. As a result, the third isolation layer 39C can be regarded as a combination of the first isolation layer 39A and the second isolation layer 39B. The interface in which the first bottom surface B1 and the second bottom surface B2 of the third isolation layer 39C are in contact with each other may be aligned maximally with the interface in which the first well 32 and the second well 33 are in contact with each other. The interface in which the first well 32 and the second well 33 are in contact with each other may be in contact with the first bottom surface B1 or the second bottom surface B2 of the third isolation layer 39C. As the interface in which the first bottom surface B1 and the second bottom surface B2 of the third isolation layer 39C are in contact with each other is aligned with the interface in which the first well 32 and the second well 33 are in contact with each other, it is easy to adjust stress balance between the third isolation layer 39C and the first and second wells 32 and 33.

In the semiconductor device having the above-described configuration, since the third isolation layer 39C is disposed in the boundary region in which the first well 32 and the second well 33 are in contact with each other, the area of the interface in which the first well 32 and the second well 33 are in contact with each other may be reduced and the inter-cell junction may be separated by the third isolation layer 39C. In this manner, the breakdown voltage characteristic and the leakage current characteristic between the first well 32 and the second well 33 may be improved.

In addition, by disposing the third isolation layer 39C in the boundary region in which the first well 32 and the second well 33 are in contact with each other, the silicide process may be easily performed because the boundary region in which the first well 32 and the second well 33 are in contact with each other is not exposed.

Furthermore, by disposing the third isolation layer 39C in the boundary region in which the first well 32 and the second well 33 are in contact with each other, it is possible to substantially prevent stress from being concentrated in the boundary region in which the first well 32 and the second well 33 are in contact with each other.

Meanwhile, even though the first isolation layer 39A or the second isolation layer 39B is formed in the boundary region in which the first well 32 and the second well 33 are in contact with each other, it is possible to substantially prevent stress from being concentrated in the boundary region in which the first well 32 and the second well 33 are in contact with each other.

However, in case where the first isolation layer 39A is formed in the boundary region in which the first well 32 and the second well 33 are in contact with each other, the depth of the isolation layer is not sufficient. Thus, interference phenomenon may occur between the semiconductor device formed in the second well 33 and the semiconductor device formed in the first well 32. In addition, since the impurity doping concentration of the second well 33 is relatively lower than the impurity doping concentration of the first well 32, a depletion region generated by the contact of the first well 32 and the second well 33 is expanded toward the second well 33, causing reduction in the breakdown voltage of the second well 33.

On the contrary, if the second isolation layer 39B is formed in the boundary region in which the first well 32 and the second well 33 are in contact with each other, stress derived by the first isolation layer 39A becomes different from stress derived by the second isolation layer 39B because the depths of the first isolation layer 39A and the second isolation layer 39B in the first well 32 are different from each other. Thus, stress unbalance occurs inside the first well 32, resulting in degradation in the operation characteristics of the semiconductor device formed in the first well 32.

Therefore, like in the illustrated examples, the third isolation layer 39C having a combination type of the first isolation layer 39A and the second isolation layer 39B may be disposed in the boundary region in which the first well 32 and the second well 33 are in contact with each other.

Furthermore, an example of the semiconductor device further includes a first well tab 40 formed on the surface of the first well 32 between the first isolation layer 39A and the second isolation layer 39B, a second well tab 41 formed on the surface of the second well 33 between the second isolation layer 39B and the third isolation layer 39C, and transistors formed in the low-voltage region and the high-voltage region.

The first well tab 40 and the second well tab 41 serve to reduce the resistances of the first well 32 and the second well 33, and serve to apply a bias voltage or a ground voltage to the first well 32 and the second well 33. The first well tab 40 and the second well tab 41 may have the same conductivity types as those of the first well 32 and the second well 33, and may have the impurity doping concentrations higher than those of the first well 32 and the second well 33.

The transistors formed in the low-voltage region and the high-voltage region include gate dielectric layers 42 and 48 formed on the well, gate electrodes 43 and 49 formed on the gate dielectric layers 42 and 48, spacers 44 and 50 formed on both sidewalls of the gate electrodes 43 and 49, and junction regions 47 and 53 formed in the well on both sides of the gate electrodes 43 and 49, respectively. The thickness of the gate dielectric layer 42 formed in the low-voltage region may be smaller than the thickness of the gate dielectric layer 48 formed in the high-voltage region. For example, the gate dielectric layer 42 formed in the low-voltage region may have the thickness ranging from approximately 15 Å to approximately 200 Å, and the gate dielectric layer 48 formed in the high-voltage region may have the thickness ranging from approximately 200 Å to approximately 1,000 Å. The junction regions 47 and 53 may have a lightly doped drain (LDD) structure including high-concentration impurity regions 45 and 51 and low-concentration impurity regions 46 and 52.

The gate dielectric layer 43, the spacer 44, and the junction region 47 formed in the low-voltage region may have differential materials, sizes (or thicknesses, depths, etc.), impurity doping concentrations from those of the gate dielectric layer 49, the spacer 50, and the junction region 53 formed in the high-voltage region.

FIGS. 3A to 3G are cross-sectional views illustrating an example of a method for fabricating a semiconductor device.

Figure 3A:
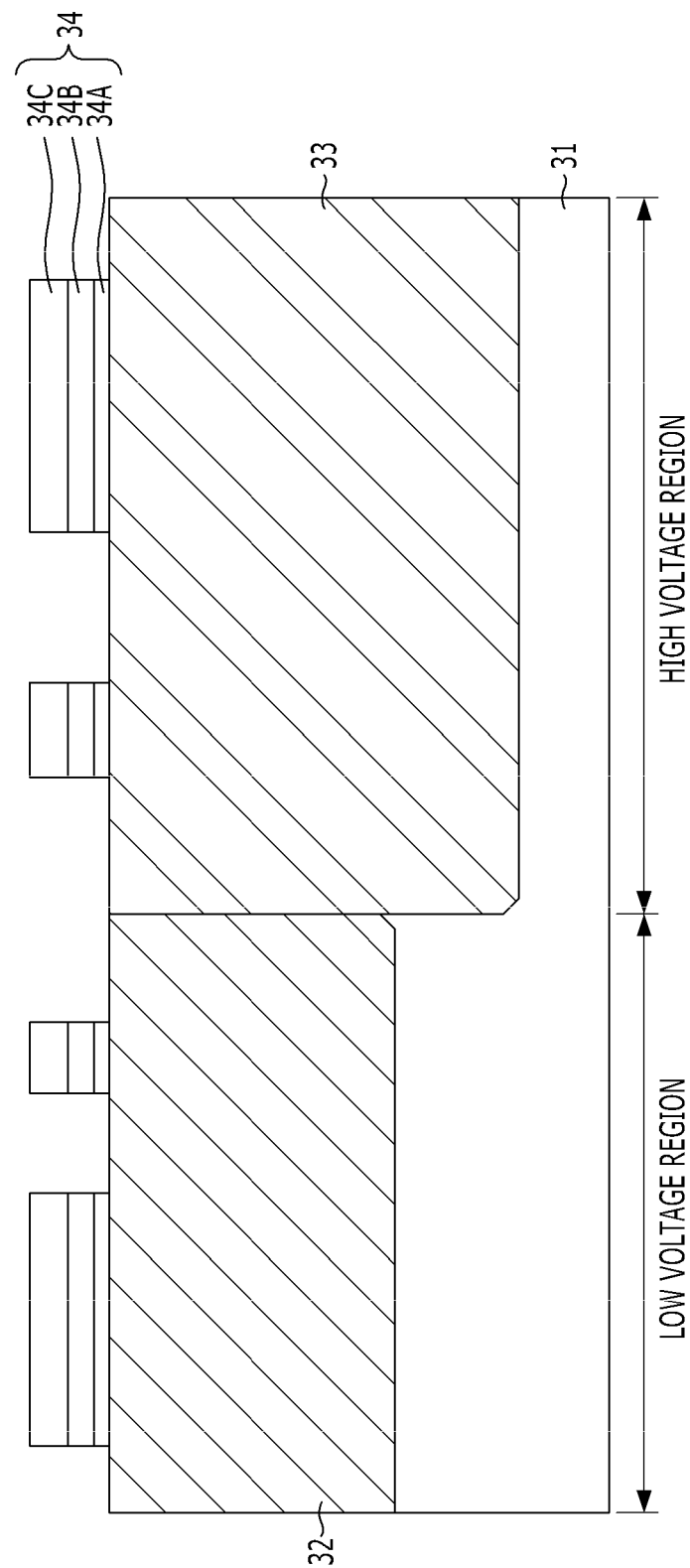

Referring to FIG. 3A, a substrate 31 having a low-voltage region and a high-voltage region is prepared. The low-voltage region may be a region in which a low-voltage semiconductor device (e.g., a transistor) is to be formed, and a high-voltage region may be a region in which a high-voltage semiconductor device is to be formed. The high-voltage semiconductor device is a device having an operating voltage higher than that of the low-voltage semiconductor device. For example, the low-voltage region may be a region in which a transistor having an operating voltage ranging from approximately 0.5 V to approximately 8 V is to be formed, and the high-voltage region may be a region in which a transistor having an operating voltage ranging from approximately 9 V to approximately 100 V is to be formed.

A silicon substrate may be used as the substrate 31, and a silicon substrate doped with P-type or N-type impurity may be used.

Impurity ions are implanted into the substrate 31 to form a first well 32 and a second well 33 in the low-voltage region and the high-voltage region, respectively. The impurity doping concentration of the first well 32 may be higher than the impurity doping concentration of the second well 33. This is because the low-voltage semiconductor device is formed in the low-voltage region in which the first well 32 is formed, not in the high-voltage region in which the second well 33 is formed. For reference, in order to ensure a breakdown voltage, the well for the formation of the high-voltage semiconductor device is formed to have a lower impurity doping concentration than that of the well for the formation of the low-voltage semiconductor device. As one example, the first well 32 may have the impurity doping concentration ranging from approximately $1 \times 10^{17}$ atoms/cm$^3$ to approximately $1 \times 10^{18}$ atoms/cm$^3$, and the second well 33 may have the impurity doping concentration ranging from approximately $1 \times 10^{16}$ atoms/cm$^3$ to approximately $1 \times 10^{17}$ atoms/cm$^3$. That is, the impurity doping concentration of the first well 32 is higher than the impurity doping concentration of the second well 33 by order of 1. The impurity doping concentration may be changed, depending on ion dose and annealing condition.

In order to increase a junction breakdown voltage in the second well 32 of the high-voltage region, a drift region may be further formed. The drift region is formed to have an impurity doping concentration higher than that of the second well 33.

Also, the depth of the second well 33 may be smaller than the depth of the first well 32 with respect to the top surface of the substrate 31. For example, the first well 32 may have the depth ranging from approximately 2 μm to approximately 3 μm, and the second well 33 may have the depth ranging from approximately 3 μm to approximately 7 μm. The depths of the first well 32 and the second well 33 may be adjusted through ion implantation energy or an annealing process.

The first well 32 and the second well 33 may have the same conductivity type or complementary conductive types. As one example, when the first well 32 is N-type, the second well 33 may be N-type or P-type. When the second well 33 is N-type, the first well 32 may be N-type or P-type.

A method for forming the first well 32 and the second well 33 will be described in more detail.

First, an impurity ion implantation process is performed in order to form the second well 33 having a depth larger than that of the first well 32. A drive-in annealing process is performed in order to diffuse the impurity ions implanted in the substrate 31. The annealing process is performed at a temperature ranging from approximately 1,100° C. to approximately 1,200° C. In this manner, the impurity ions implanted through the high-temperature annealing process are diffused under the substrate 31 to thereby form the second well 33.

An impurity ion implantation process is performed in order to form the first well 32. An additional annealing process for the first well 32 is not performed, and first well 32 is activated using an annealing process performed between subsequent processes.

The impurity ion implantation process for the formation of the first well 32 is performed after the formation of the second well 33 in order to avoid diffusion caused by the drive-in annealing process performed at a high temperature. If the high-temperature annealing process is performed after the impurity ion implantation process for the formation of the first well 32 and the second well 33, the depth of the first well 32 is increased by the high-temperature annealing process. Consequently, the dept of the first well 32 becomes different from the target depth. If the high-temperature drive-in annealing process is not performed, the formation order of the first well 32 and the second well 33 may be changed, depending on formation conditions of the semiconductor device.

In addition, the first well 32 may be formed after forming an isolation layer having an MTI structure. That is, after the second well 23 is formed, the isolation layer may be formed and then the first well 32 may be formed. Alternatively, after the isolation layer is formed, the first well 32 and the second well 33 may be formed. In case where the high-temperature drive-in annealing process is performed, the ion implantation process for forming the first well 32 is performed after forming the second well 33. For convenience, in this example, it is assumed that isolation layers having an STI structure and an MTI structure are formed after forming the first well 32 and the second well 33.

In order to form a trench for device isolation, a hard mask pattern 34 is formed on the substrate 31. The hard mask pattern 34 may include one layer selected from the group consisting of an oxide layer, a nitride layer, an oxynitride layer, a carbon-containing layer, and a stacked layer thereof.

For example, the hard mask pattern 34 is a stacked layer formed by sequentially stacking a first oxide layer 34A, a nitride layer 34B, and a second oxide layer 34C. The second oxide layer 34C protects the nitride layer 34B and serves as a hard mask in a primary etching process and a secondary etching process which will be subsequently performed. A method for forming the hard mask pattern 34 will be described. The first oxide layer 34A, the nitride layer 34B, and the second oxide layer 34C are sequentially formed on the substrate 31. The first oxide layer 34A is a high-temperature thermal oxide layer formed at 750° C. or more and is formed to have the thickness ranging from approximately 10 nm to approximately 30 nm. The nitride layer 34B and the second oxide layer 34C are formed using a low pressure chemical vapor deposition (LPCVD) process. The nitride layer 34B is formed to have the thickness ranging from approximately 80 nm to approximately 250 nm. The second oxide layer 34C is formed to have the thickness ranging from approximately 100 nm to approximately 300 nm. A BARC material for an anti-reflective coating layer and a photoresist layer are deposited on the second oxide layer 34C, and the BARC material and the photoresist layer are patterned through an exposure process and a development process. The second oxide layer 34C, the nitride layer 34B, and the first oxide layer 34A are sequentially etched using the patterned BARC material and photoresist layer as a mask, thereby forming a hard mask pattern 34 exposing the substrate 31. After forming the hard mask pattern 34, the BARC material and the photoresist layer are removed through an asking process or a stripping process.

Figure 3B:
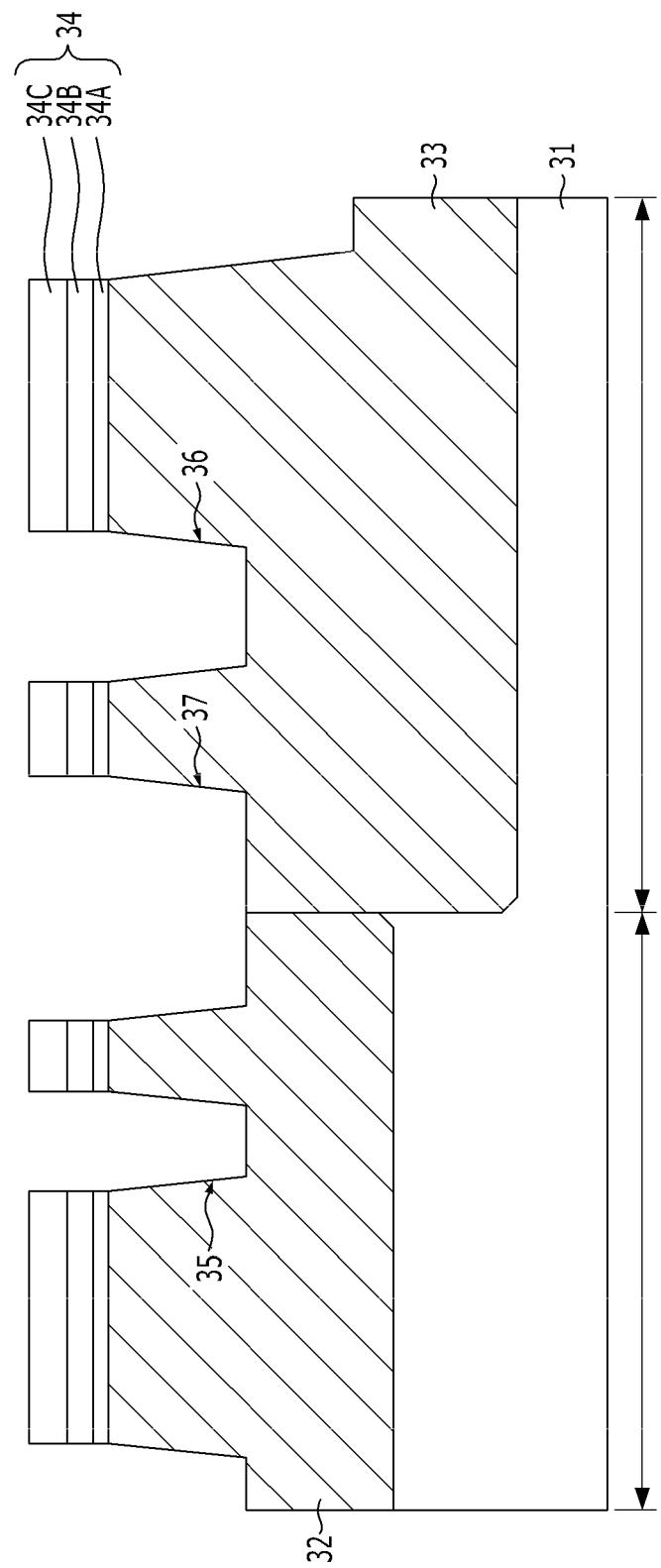

Referring to FIG. 3B, a primary etching process is performed to etch the substrate 31 to a predetermined depth by using the hard mask pattern 34 as an etch barrier, thereby forming a first trench 35 and a second trench 36 in the first well 32 and the second well 33, respectively, and a third trench 37 having a combination type of the first trench 35 and the second trench 36 in the boundary region in which the first well 32 and the second well 33 are in contact with each other. At this time, the critical dimension of the second trench 36 may be larger than the critical dimension of the first trench 35. The depth of the third trench 37 is substantially equal to the depth of the first and second trenches 35 and 36. The critical dimension of the third trench 37 is substantially equal to the sum of the critical dimensions of the first and second trenches 35 and 36.

The first to third trenches 35, 36 and 37 formed through the primary etching process is formed to have the depth of the isolation layer of the STI structure required by the semiconductor device which will be formed in the low-voltage region.

Figure 3C:
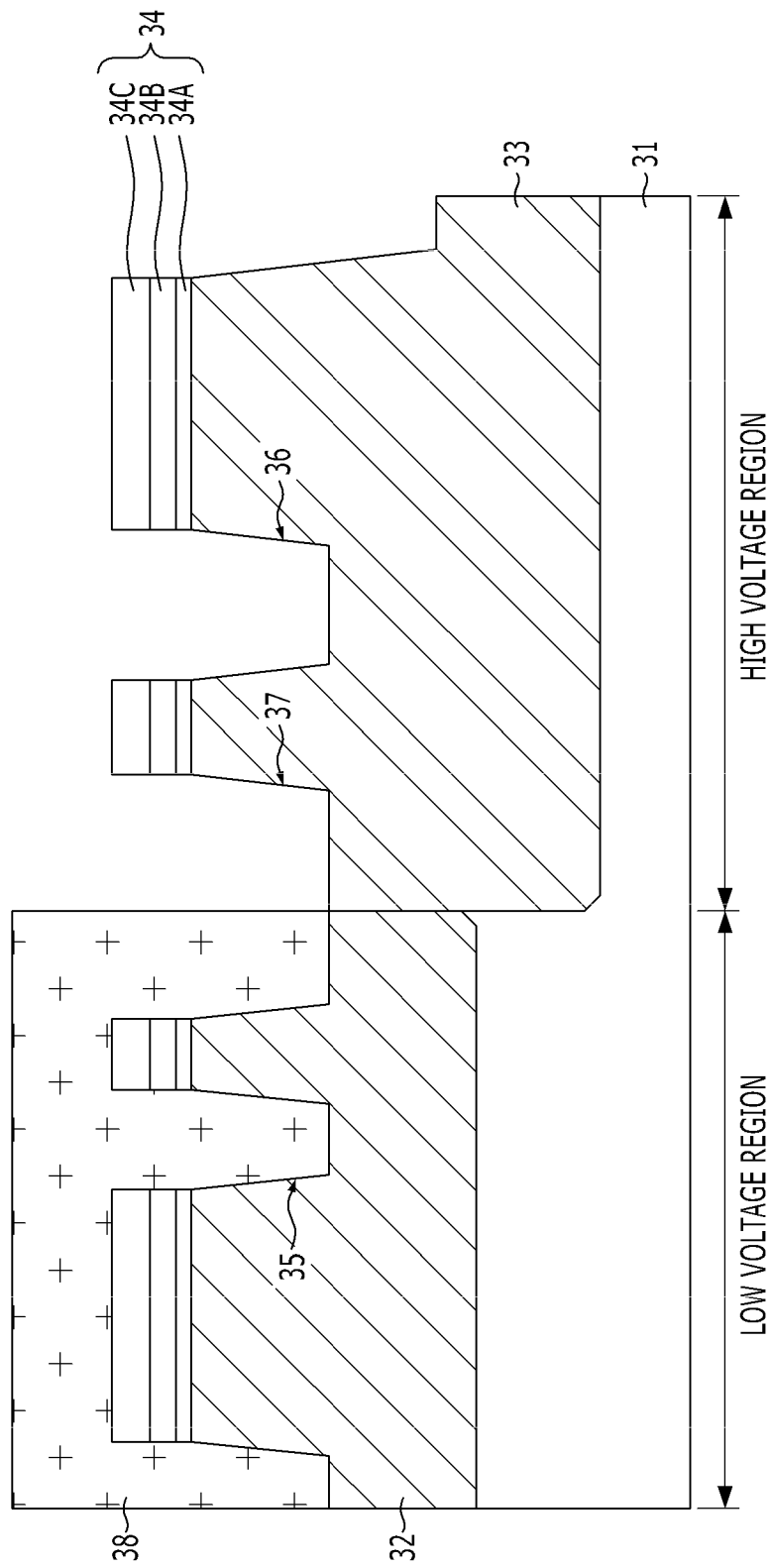

Referring to FIG. 3C, a sacrificial pattern 38 is formed on the substrate 31. The sacrificial pattern 38 may cover the low-voltage region and open the high-voltage region, or may cover the first well 32 and open the second well 33. That is, the sacrificial pattern 38 filling the first trench 35 and covering a portion of the bottom surface of the third trench 37 is formed. The sacrificial pattern 38 is formed using a photoresist (PR) layer. An i-line photoresist is used as the photoresist layer, and the photoresist layer is deposited to a thickness ranging from approximately 1 μm to approximately 2 μm.

In case where the sacrificial pattern 38 is formed using the photoresist layer, the photoresist layer is deposited over the substrate 31 to fill the first to third trenches 35, 36 and 37 and cover the top surface of the hard mask pattern 34, and the sacrificial pattern 38 is then formed through a series of processes, including an exposure process and a development process using a mask defining the first well 32 or a mask defining the low-voltage region.

In this case, the sidewall of the sacrificial pattern 38 contacting the bottom surface of the third trench 37 may be aligned with the interface in which the first well 32 and the second well 33 are in contact with each other. However, misalignment is allowable within a range of ±0.3 μm from the interface in which the first well 32 and the second well 33 are in contact with each other.

Referring to FIG. 3D, a secondary etching process is performed to etch the substrate 31 by using the sacrificial pattern 38 and the hard mask pattern 34 as an etch barrier. Specifically, by etching the bottom surface of the second trench 6 by using the sacrificial pattern 38 and the hard mask pattern 34 as an etch barrier, the depth of the second trench 36 is increased. At the same time, by etching the bottom surface of the third trench 37 exposed by the sacrificial pattern 38, the depth of a portion of the third trench 37 is increased. Hereinafter, the second trench 36 and the third trench 37 whose depths are increased will be represented by reference numerals "36A" and "37A", respectively.

While forming the second trench 36A and the third trench 37A whose depths are increased, the second oxide layer 34C of the hard mask pattern 34 is partially damaged by an etching gas. At this time, the damage degree of the second oxide layer 34C is changed, depending on the etch selectivity between the second oxide layer 34C and the substrate 31.

The second and third trenches 36A and 37A whose depths are increased through the secondary etching process are formed to have the depth of the isolation layer having the MTI structure required by the semiconductor device which will be formed in the high-voltage region.

The sacrificial pattern 38 is removed using an ashing process.

Meanwhile, after removing the sacrificial pattern 38, the second oxide layer 34C of the hard mask pattern 34 may be removed according to conditions of subsequent processes. For example, in case where a liner nitride layer is deposited on the first to third trenches 35, 36A and 37A before filling the first to third trenches 35, 36A and 37A with an insulation material, the second oxide layer 34C of the hard mask pattern 34 may be removed. Specifically, if a subsequent process is performed in such a state that the second oxide layer 34C is not removed, the insulation material filling the first to third trenches 35, 36A and 37A is formed on the first oxide layer 34A, the nitride layer 34B, the second oxide layer 34C, and the liner nitride layer. Thus, a CMP stopping occurs in the second oxide layer 34C during a CMP process and thus it is difficult to remove the nitride layer 34B. Therefore, in the case of the semiconductor device in which the linear nitride layer is formed on the first to third trenches 35, 36A and 37A after removing the sacrificial pattern 38, the second oxide layer 34C which is the top surface of the hard mask pattern 34 may be removed. In this case, the second oxide layer 34C may be removed by a wet etching process or a dry etching process. In the case of a process in which the linear nitride layer is not formed, the second oxide layer 34C which is the top surface of the hard mask pattern 34 may not be removed. This embodiment is an embodiment in which the second oxide layer 34C is not removed.

Figure 3E:
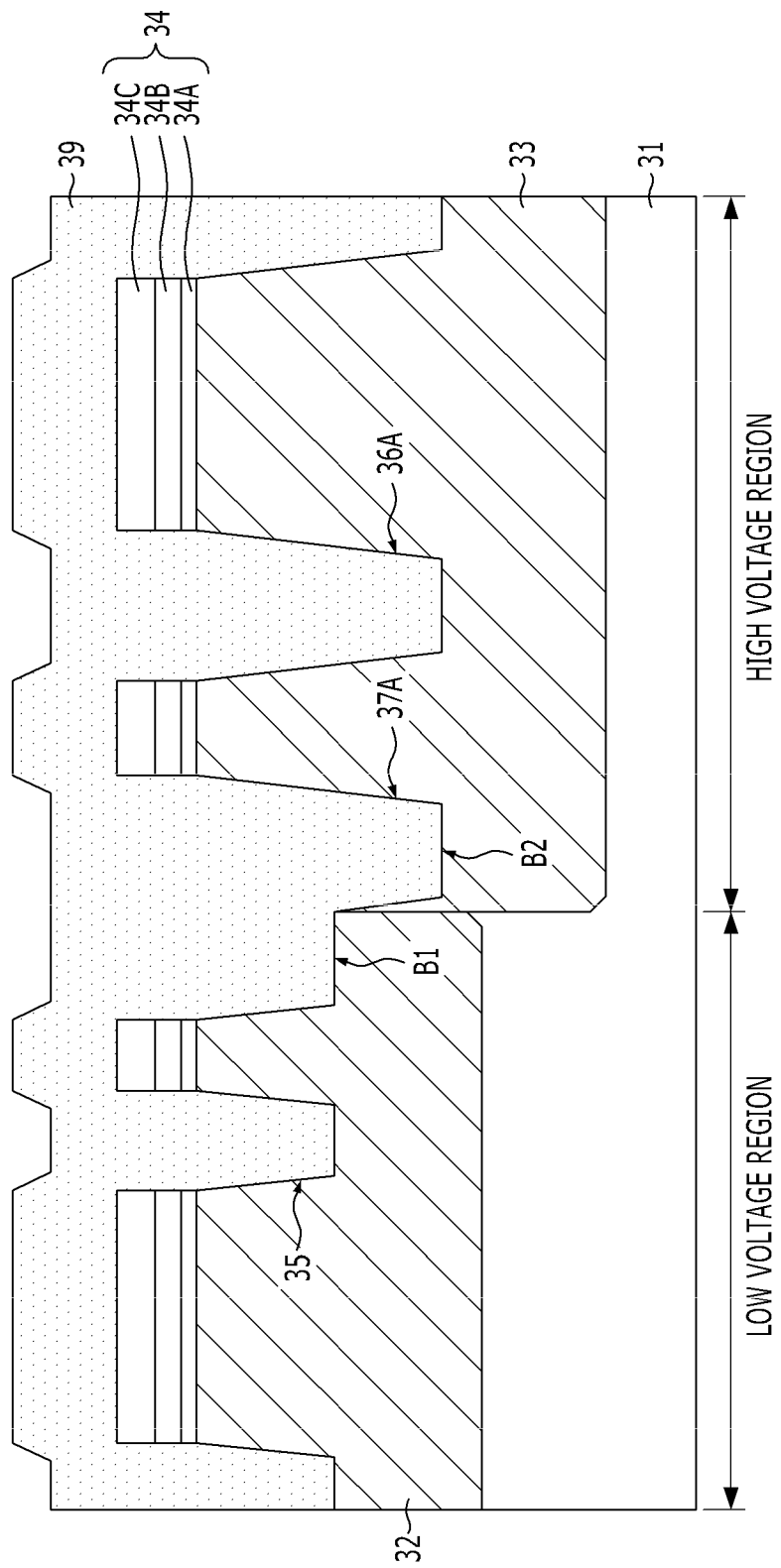

Referring to FIG. 3E, an insulation layer 39 is deposited over the substrate 31 to completely fill the first to third trenches 35, 36A and 37A. At this time, it is important to deposit the insulation layer 39 so that void may not be generated inside the insulation layer 39. A high density plasma (HDP) oxide layer is widely used. Although the deposition thickness of the insulation layer 39 is dependent on the etch depth of the first to third trenches 35, 36A and 37A, the insulation layer 39 is deposited to a thickness ranging from approximately 1 μm to approximately 3 μm.

Meanwhile, before depositing the insulation layer 39, a sidewall oxide layer and a liner nitride layer are deposited on the first to third trenches 35, 36A and 37A in order to reduce stress. The linear nitride layer is provided between the substrate 31, e.g., a silicon substrate, and the HDP oxide layer, and serves to reduce stress generated between the substrate 31 and the HDP oxide layer.

In the example method for fabricating the semiconductor device, after forming the first to third trenches 35, 36A and 37A having the depths required by the respective regions, the insulation layer 39 filling the first to third trenches 35, 36A and 37A is formed through one-time deposition process.

In some cases, an etching process for removing the height difference of the top surface of the insulation layer 39 may be performed. For example, after depositing the HDP oxide layer to fill the first to third trenches 35, 36A and 37A, a high-temperature annealing process is performed at a temperature of approximately 900° C. to approximately 1,100° C. Then, the height difference may be reduced by etching the surface of the HDP oxide layer by using a buffered oxide etchant (BOE) for approximately 1 minute to approximately 10 minutes so that the deposited HDP oxide layer has a gentle inclination angle.

Figure 3F:
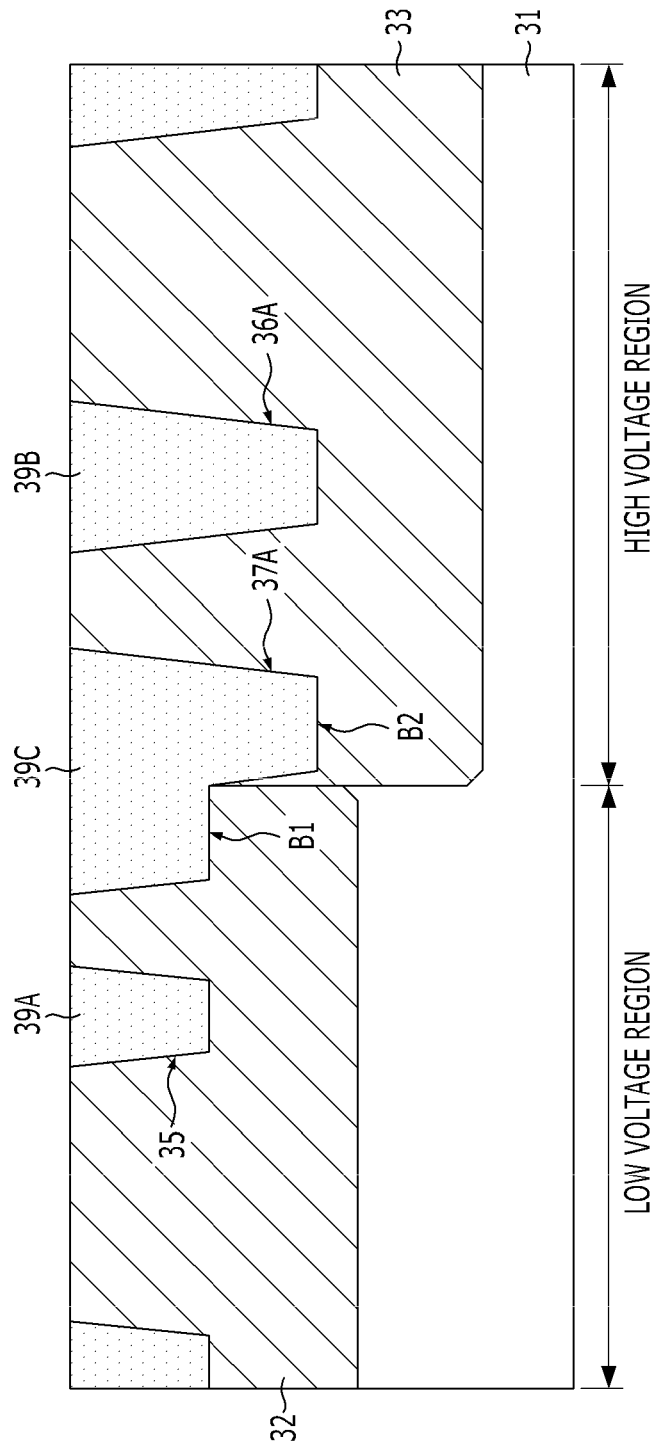

Referring to FIG. 3F, the insulation layer 39 is planarized until the top surface of the hard mask pattern 34 is exposed, thereby forming a first isolation layer 39A buried in the first trench 35, a second isolation layer 39B buried in the second trench 36A, and a third isolation layer 39C buried in the third trench 37A.

The third isolation layer 39C formed through the above-described process in the boundary region in which the first well 32 and the second well 33 are in contact with each other serves to substantially prevent stress from being concentrated in the boundary region in which the first well 32 and the second well 33 are in contact with each other, and also serves to separate the semiconductor device formed in the first well 32 from the semiconductor device formed in the second well 33. The third isolation layer 39C has a first bottom surface B1 whose height is substantially equal to the height of the bottom surface of the first isolation layer 39A, and a second bottom surface B2 whose height is substantially equal to the height of the bottom surface of the second isolation layer 39B. Accordingly, the third isolation layer 39C can be regarded as a combination of the first isolation layer 39A and the second isolation layer 39B.

The hard mask pattern 34 is removed. Consequently, the process of forming the isolation layer is completed.

Figure 3G:
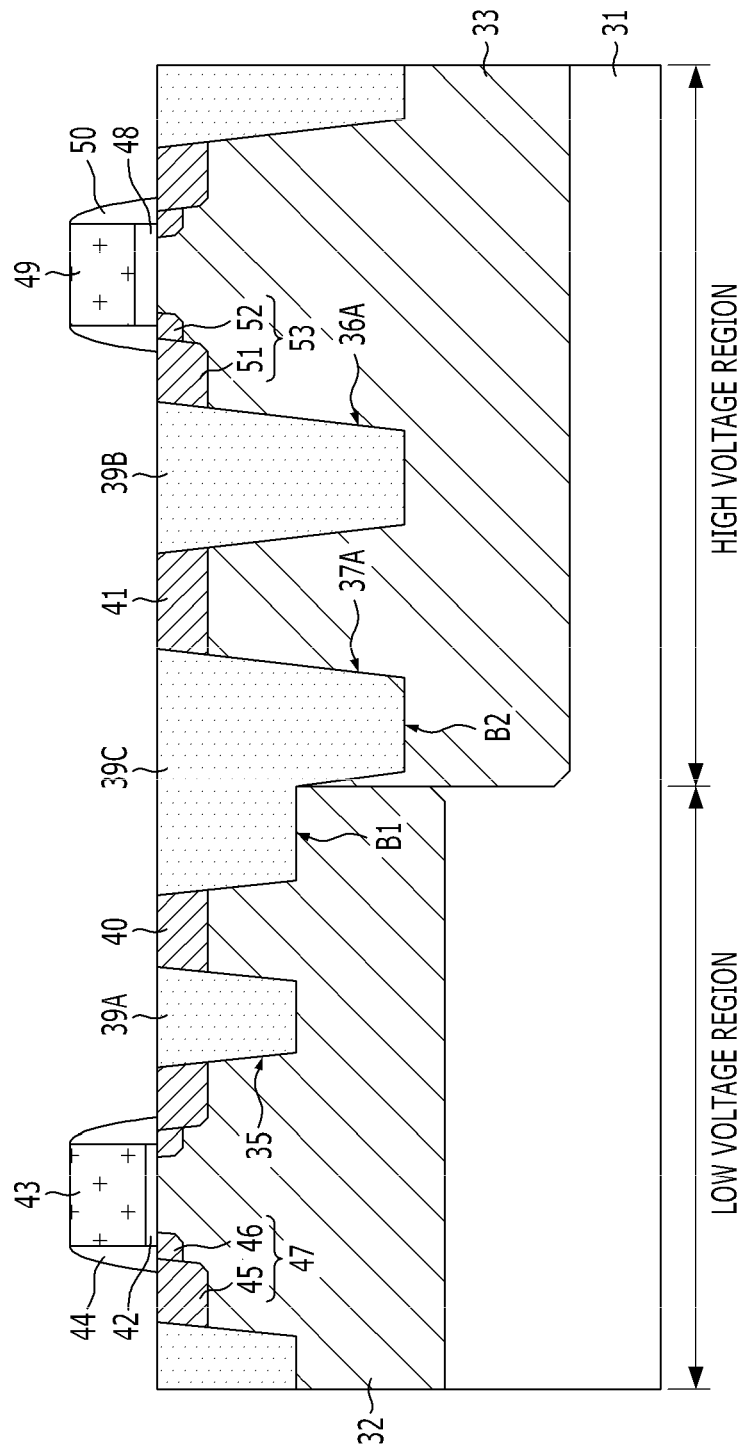

Referring to FIG. 3G, a first well tab 40 is formed on the surface of the first well 32 between the first isolation layer 39A and the second isolation layer 39B, a second well tab 41 is formed on the surface of the second well 33 between the second isolation layer 39B and the third isolation layer 39C. The first well tab 40 and the second well tab 41 serve to reduce the resistances of the first well 32 and the second well 33, and serve to apply a bias voltage or a ground voltage to the first well 32 and the second well 33. The first well tab 40 and the second well tab 41 may have the same conductivity types as those of the first well 32 and the second well 33, and may have the impurity doping concentrations higher than those of the first well 32 and the second well 33.

Transistors are formed in the low-voltage region and the high-voltage region, respectively. The transistors formed in the low-voltage region and the high-voltage region include gate dielectric layers 42 and 48 formed on the well, gate electrodes 43 and 49 formed on the gate dielectric layers 42 and 48, spacers 44 and 50 formed on both sidewalls of the gate electrodes 43 and 49, and junction regions 47 and 53 formed in the well on both sides of the gate electrodes 43 and 49, respectively.

The thickness of the gate dielectric layer 42 formed in the low-voltage region is smaller than the thickness of the gate dielectric layer 48 formed in the high-voltage region. For example, the gate dielectric layer 42 formed in the low-voltage region may have the thickness ranging from approximately 15 Å to approximately 200 Å, and the gate dielectric layer 48 formed in the high-voltage region may have the thickness ranging from approximately 200 Å to approximately 1,000 Å.

The junction regions 47 and 53 may have a lightly doped drain (LDD) structure including high-concentration impurity regions 45 and 51 and low-concentration impurity regions 46 and 52.

The gate dielectric layer 43, the spacer 44, and the junction region 47 formed in the low-voltage region may have differential materials, sizes (or thicknesses, depths, etc.), impurity doping concentrations from those of the gate dielectric layer 49, the spacer 50, and the junction region 53 formed in the high-voltage region.

In the example semiconductor device formed by the fabricating method, the third isolation layer 39C is disposed in the boundary region in which the first well 32 and the second well 33 are in contact with each other.

By disposing the third isolation layer 39C in the boundary region in which the first well 32 and the second well 33 are in contact with each other, the area of the interface in which the first well 32 and the second well 33 are in contact with each other may be reduced and the inter-cell junction may be separated by the third isolation layer 39C.

Furthermore, by disposing the third isolation layer 39C in the boundary region in which the first well 32 and the second well 33 are in contact with each other, the silicide process may be affected because the boundary region, in which the first well 32 and the second well 33 are in contact, is not exposed.

Moreover, the well tabs on the surfaces of the first and second wells are provided adjacent to the third isolation layer 39C.

While a number of examples have been described above, it will be apparent to those skilled in the art that various changes and modifications may be made without departing from the spirit and scope of the following claims.

What is claimed is:

1. A semiconductor device, comprising:
   a first well in a substrate;
   a second well in the substrate, the second well comprising an impurity doping concentration that is different from an impurity doping concentration of the first well;
   a first isolation layer in the first well;
   a second isolation layer in the second well, the second isolation layer comprising a structure that is different from a structure of the first isolation layer; and
   a third isolation layer in a boundary region in which the first well and the second well are in contact, the third isolation layer comprising a combination of the structure of the first isolation layer and the structure of the second isolation layer.

2. The semiconductor device of claim 1, wherein the substrate comprises a low-voltage region and a high-voltage region,
   wherein the first well is in the low-voltage region, and
   wherein the second well is in the high-voltage region.

3. The semiconductor device of claim 1, wherein the impurity doping concentration of the first well is greater than the impurity doping concentration of the second well.

4. The semiconductor device of claim 1, wherein the first isolation layer comprises a depth that is less than a depth of the second isolation layer, and
   wherein the third isolation layer comprises the depth of the first isolation layer and the depth of the second isolation layer.

5. The semiconductor device of claim 4, wherein an interface in which the first isolation layer and the second isolation layer are in contact with each other is aligned with an interface in which the first well and the second well are in contact with each other.

6. A semiconductor device, comprising:
   a substrate of a first conductivity type;
   a first well of a second conductivity type, the first well being on the substrate;
   a second well of the second conductivity type, the second well being on the substrate and comprising an impurity doping concentration that is less than an impurity doping concentration of the first well;
   a first isolation layer in the first well, the first isolation layer comprising a first structure and a first depth;
   a second isolation layer in the second well, the second isolation layer comprising a second structure and a second depth, the first structure being different from a second structure, and the second depth being greater than the first depth; and
   a third isolation layer in a boundary region in which the first well and the second well are in contact, the third isolation layer comprising a combination of the structure of the first isolation layer and the structure of the second isolation layer.

7. The semiconductor device of claim 1, wherein the structure of the first isolation layer comprises a shallow trench isolation (STI) structure, and
   wherein the structure of the second isolation layer comprises a medium isolation trench (MTI) structure.

* * * * *